US012568845B2

(12) United States Patent
Xue et al.

(10) Patent No.: US 12,568,845 B2
(45) Date of Patent: Mar. 3, 2026

(54) CHIP SCALE SEMICONDUCTOR PACKAGE HAVING BACK SIDE METAL LAYER AND RAISED FRONT SIDE PAD AND METHOD OF MAKING THE SAME

(71) Applicant: ALPHA AND OMEGA SEMICONDUCTOR INTERNATIONAL LP, Toronto (CA)

(72) Inventors: Yan Xun Xue, Los Gatos, CA (US); Madhur Bobde, Sunnyvale, CA (US); Long-Ching Wang, Cupertino, CA (US); Zhiqiang Niu, Santa Clara, CA (US); Lin Lv, Shanghai (CN)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 351 days.

(21) Appl. No.: 18/236,856

(22) Filed: Aug. 22, 2023

(65) Prior Publication Data
US 2025/0069973 A1    Feb. 27, 2025

(51) Int. Cl.
| | |
|---|---|
| *H01L 23/31* | (2006.01) |
| *H01L 21/28* | (2025.01) |
| *H01L 21/304* | (2006.01) |
| *H01L 23/00* | (2006.01) |
| *H01L 23/498* | (2006.01) |

(52) U.S. Cl.
CPC .... *H01L 23/3114* (2013.01); *H01L 21/28123* (2013.01); *H01L 21/304* (2013.01); *H01L 23/49816* (2013.01); *H01L 24/13* (2013.01); *H01L 24/29* (2013.01); *H01L 24/97* (2013.01);

*H01L 2224/13007* (2013.01); *H01L 2224/13147* (2013.01); *H01L 2224/29147* (2013.01); *H01L 2224/97* (2013.01); *H01L 2924/13091* (2013.01); *H01L 2924/1811* (2013.01)

(58) Field of Classification Search
CPC ......... H01L 24/13; H01L 24/29; H01L 24/97; H01L 21/28123; H01L 21/304; H01L 23/3114; H01L 23/49816
See application file for complete search history.

(56) References Cited

U.S. PATENT DOCUMENTS

| | | | |
|---|---|---|---|
| 8,338,232 | B2 | 12/2012 | Shi et al. |
| 2007/0166881 | A1 | 7/2007 | Liu |

(Continued)

FOREIGN PATENT DOCUMENTS

| | | |
|---|---|---|
| CN | 112038305 A | 12/2020 |
| TW | 201306203 A | 2/2013 |

*Primary Examiner* — Steven M Page
(74) *Attorney, Agent, or Firm* — Chen-Chi Lin

(57) ABSTRACT

A chip scale semiconductor package comprises a silicon layer, a back side metal layer, and a plurality of front side pads. Each of the plurality of front side pads comprises a respective copper member and a respective solder member. A method comprises the steps of: providing a wafer; grinding the back side of the wafer forming a peripheral ring; applying a metallization process to a grinded surface; removing the peripheral ring; forming a front side seed layer; forming a front side photoresist layer; applying a photolithography process; applying a front side copper plating process; applying a front side solder plating process; stripping the front side photoresist layer; etching the front side seed layer; and applying a singulation process.

12 Claims, 20 Drawing Sheets

899

(56) References Cited

U.S. PATENT DOCUMENTS

| | | | | |
|---|---|---|---|---|
| 2017/0372962 A1* | 12/2017 | Seddon | .................. | H01L 22/32 |
| 2019/0006308 A1 | 1/2019 | Appelt | | |
| 2019/0080965 A1* | 3/2019 | Seddon | .............. | H01L 21/0332 |
| 2023/0145610 A1 | 5/2023 | Chen et al. | | |

* cited by examiner

402

406

404

414

412

404

418

422

424

432

436

432

442

432

452

432

500

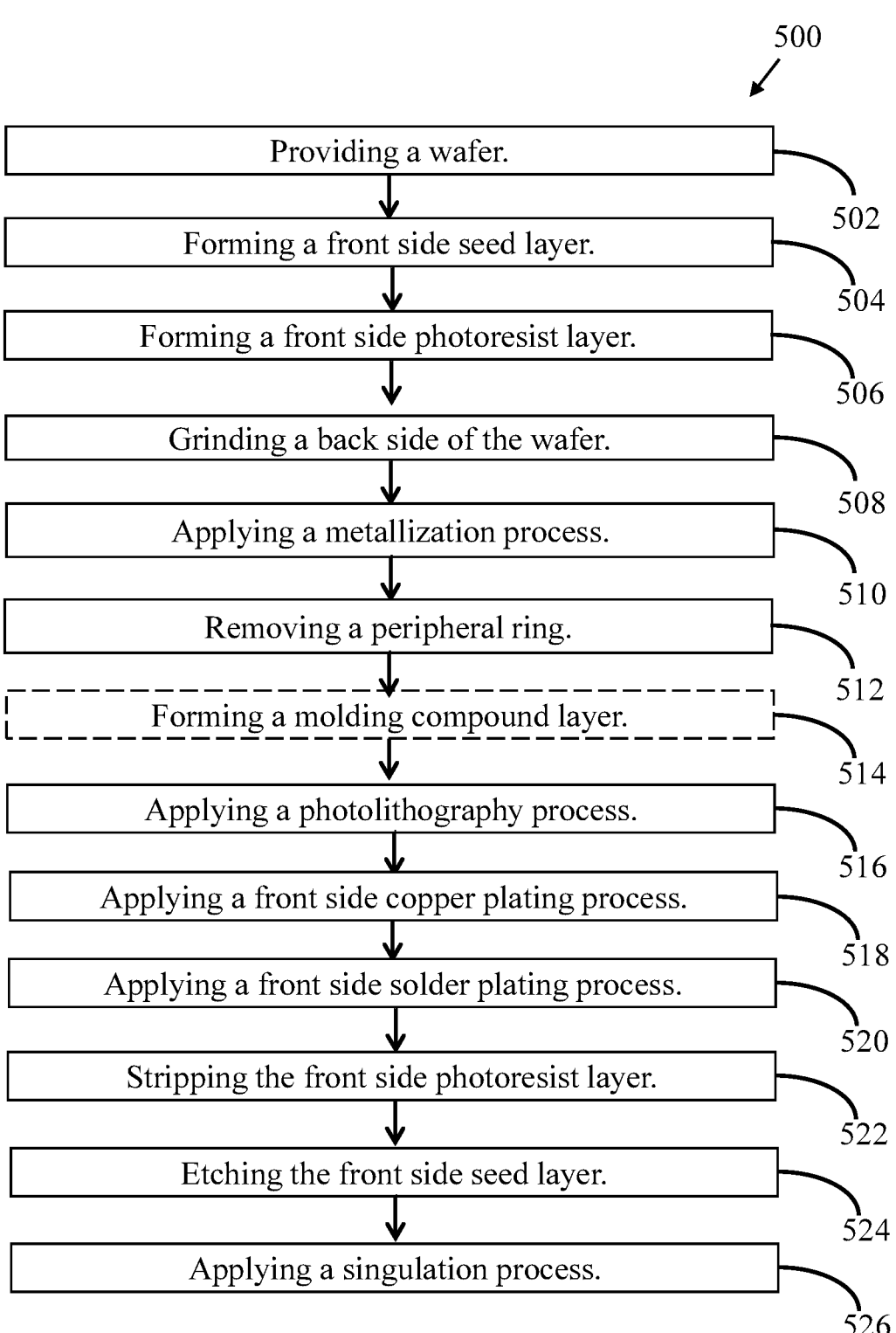

Providing a wafer.
502

Forming a front side seed layer.
504

Forming a front side photoresist layer.
506

Grinding a back side of the wafer.
508

Applying a metallization process.
510

Removing a peripheral ring.
512

Forming a molding compound layer.
514

Applying a photolithography process.
516

Applying a front side copper plating process.
518

Applying a front side solder plating process.
520

Stripping the front side photoresist layer.
522

Etching the front side seed layer.
524

Applying a singulation process.
526

FIG. 5

602
606
604
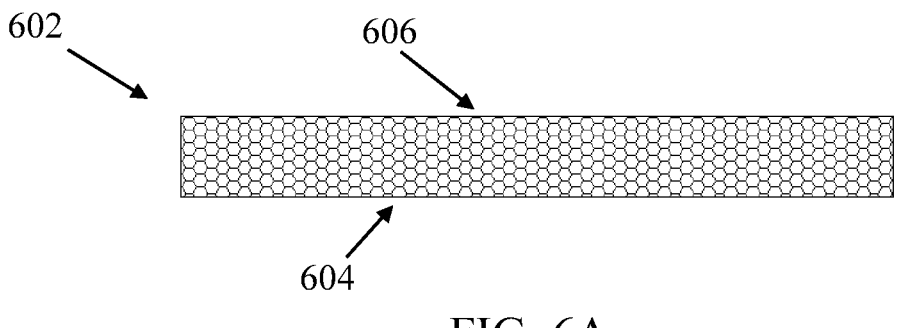
FIG. 6A
636
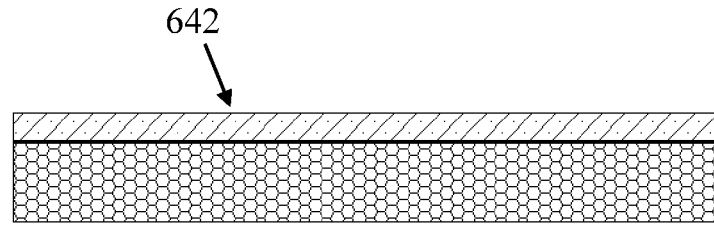
FIG. 6B
642
FIG. 6C
612
614
642
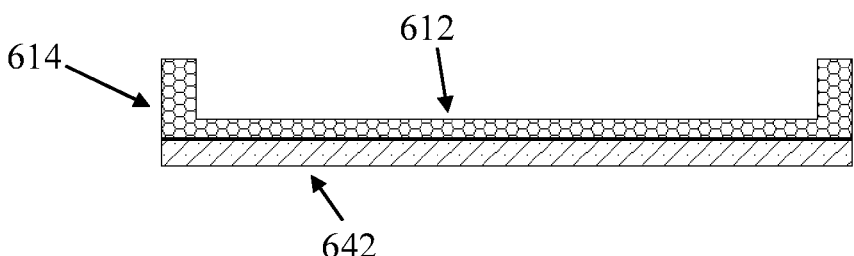
FIG. 6D

618

622

624

632

652

632

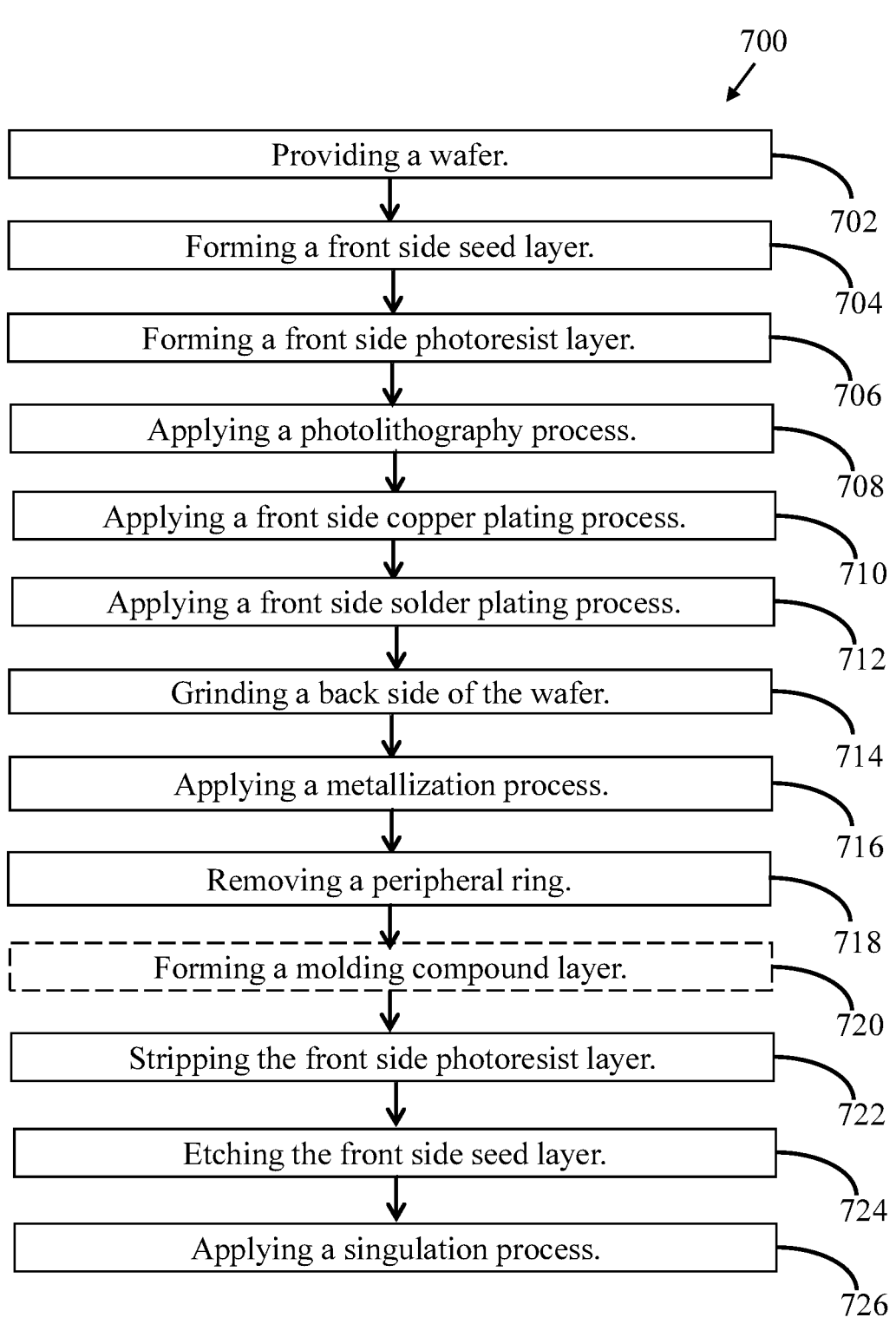

700

| Providing a wafer. | 702 |
| Forming a front side seed layer. | 704 |
| Forming a front side photoresist layer. | 706 |
| Applying a photolithography process. | 708 |
| Applying a front side copper plating process. | 710 |
| Applying a front side solder plating process. | 712 |
| Grinding a back side of the wafer. | 714 |
| Applying a metallization process. | 716 |
| Removing a peripheral ring. | 718 |
| Forming a molding compound layer. | 720 |
| Stripping the front side photoresist layer. | 722 |
| Etching the front side seed layer. | 724 |
| Applying a singulation process. | 726 |

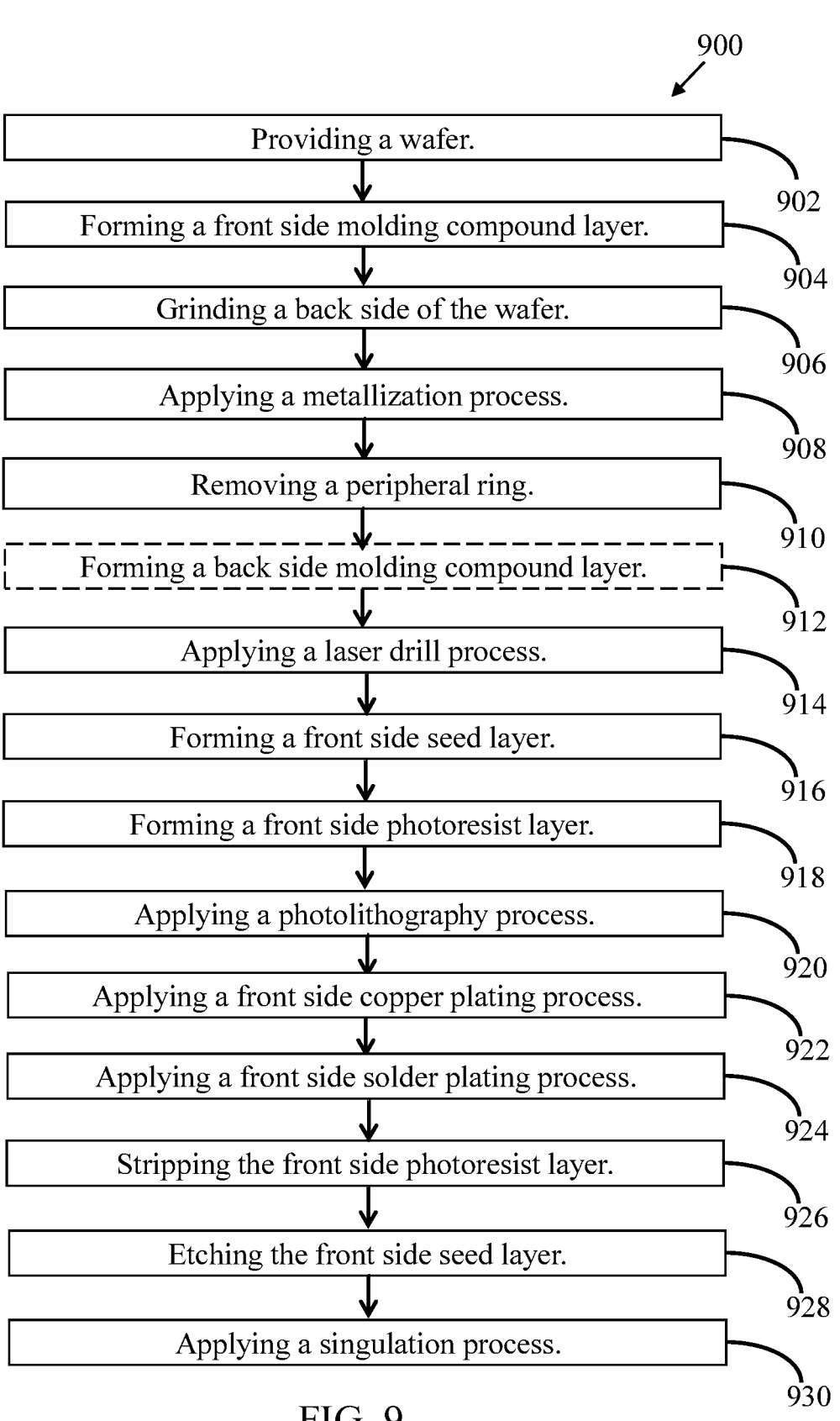

900

| Providing a wafer. |
| 902 |

| Forming a front side molding compound layer. |
| 904 |

| Grinding a back side of the wafer. |
| 906 |

| Applying a metallization process. |
| 908 |

| Removing a peripheral ring. |
| 910 |

| Forming a back side molding compound layer. |
| 912 |

| Applying a laser drill process. |
| 914 |

| Forming a front side seed layer. |
| 916 |

| Forming a front side photoresist layer. |
| 918 |

| Applying a photolithography process. |
| 920 |

| Applying a front side copper plating process. |
| 922 |

| Applying a front side solder plating process. |
| 924 |

| Stripping the front side photoresist layer. |
| 926 |

| Etching the front side seed layer. |
| 928 |

| Applying a singulation process. |
| 930 |

CHIP SCALE SEMICONDUCTOR PACKAGE HAVING BACK SIDE METAL LAYER AND RAISED FRONT SIDE PAD AND METHOD OF MAKING THE SAME

FIELD OF THE INVENTION

This invention relates generally to a chip scale semiconductor package having a back side metal layer and raised front side pads and a method of making the chip scale semiconductor package. More particularly, the present invention relates to a chip scale power semiconductor package having each of the raised front side pads comprising a copper member and a solder member.

BACKGROUND OF THE INVENTION

A conventional chip scale power semiconductor package comprises flat pads causing printed circuit board (PCB) level soldering issues thereby increasing the chance that the conventional chip scale power semiconductor package being peeled off from the PCB.

The present disclosure introduces raised pads to improve PCB level soldering reliability. Each of the raised pads comprises a copper member and a solder member thereby increasing wettable area during a solder reflow process and increasing a space for forming the under-fill process. A thick metal layer, in a range from 25 microns to 50 microns, improves electrical performance. Optional molding compound layers further improves mechanical strength of the chip scale semiconductor package.

SUMMARY OF THE INVENTION

The present invention discloses a chip scale semiconductor package comprising a silicon layer, a back side metal layer, and a plurality of front side pads. Each of the plurality of front side pads comprises a respective copper member and a respective solder member.

The present invention discloses a method for fabricating a chip scale semiconductor package. The method comprises the steps of: providing a wafer; grinding the back side of the wafer forming a peripheral ring; applying a metallization process to a grinded surface; removing the peripheral ring; forming a front side seed layer; forming a front side photoresist layer; applying a photolithography process; applying a front side copper plating process; applying a front side solder plating process; stripping the front side photoresist layer; etching the front side seed layer; and applying a singulation process.

BRIEF DESCRIPTION OF THE DRAWINGS

Each of FIGS. 1A, 1B, 1C, and 1D shows a perspective view of a respective chip scale semiconductor package in examples of the present disclosure.

FIG. 5 is a flowchart of a process to develop other plurality of chip scale semiconductor packages in examples of the present disclosure.

FIGS. 6A, 6B, 6C, 6D, 6E, 6F, 6G, 6H, 6I, 6J, 6K, 6L, and 6M show cross-sectional views of the steps of the process to fabricate the other plurality of chip scale semiconductor packages in examples of the present disclosure.

FIG. 7 is a flowchart of a process to develop still other plurality of chip scale semiconductor packages in examples of the present disclosure.

FIG. 9 is a flowchart of a process to develop yet still other plurality of chip scale semiconductor packages in examples of the present disclosure.

DETAILED DESCRIPTION OF THE INVENTION

Figure 1A:
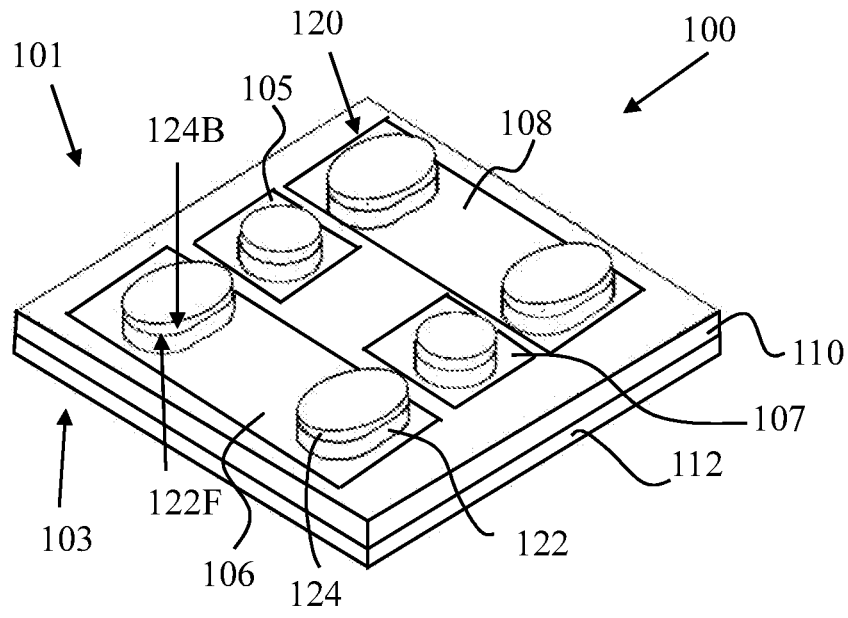

FIG. 1A shows a perspective view of a chip scale semiconductor package 100 in examples of the present disclosure. In one example, the chip scale semiconductor package 100 is a common drain power semiconductor package. The chip scale semiconductor package 100 has a front side 101 and a back side 103. The chip scale semiconductor package 100 comprises a silicon layer 110, a back side metal layer 112, and a plurality of front side pads 120. In one example, the silicon layer 110 comprises a first MOSFET transistor and a second MOSFET transistor formed thereon. Each of the first MOSFET transistor and the second MOSFET transistor comprises a gate region and a source region on a front side of the silicon layer 110, and a drain region at a back side of the silicon layer 110 opposite the front side. The back side metal layer forms a common drain electrode of the first MOSFET and second MOSFET. The plurality of frond side pads 120 include a first gate pad connecting to a first gate metal 105 of the first MOSFET, one or more first source pads connecting to a first source metal 106 of the first MOSFET, and a second gate pad connecting to a second gate metal 107 of the second MOSFET, one or more second source pads connecting to a second source metal 108 of the second MOSFET. Each of the plurality of front side pads 120 comprises a respective copper member 122 and a respective solder member 124. A back surface 124B of the respective solder member 124 is directly attached to a front surface 122F of the respective copper member 122.

In one example, a thickness of the respective copper member 122 of each of the plurality of front side pads 120 is in a range from 25 microns to 50 microns. A thickness of the respective solder member 124 of each of the plurality of front side pads 120 is in a range from 1 micron to 5 microns. A thickness of the silicon layer 110 is in a range from 30 microns to 100 microns. The first gate metal 105, the first source metal 106, the second gate metal 107 and the second source metal 108 are electrically connected to the gate regions and source regions of the first and second MOSFET transistors respectively and may be formed by patterning a front metal layer of Aluminum or Aluminum alloy overlaying the front side of the silicon layer 110. A front surface of the front metal layer forms the outermost front surface of the chip scale semiconductor package 100. A passivation layer may overlay a periphery of each of the first gate metal, the first source metal, the second gate metal and the second source metal. The copper member of each front side pad extends from a front surface of the front metal layer up to a height in a range from 25 microns to 50 microns. In one example, the respective solder member 124 comprises Sn. In another example, the respective solder member 124 comprises Sn and Ni. In still another example, the respective solder member 124 comprises Sn, Ni, and Au.

Figure 1B:
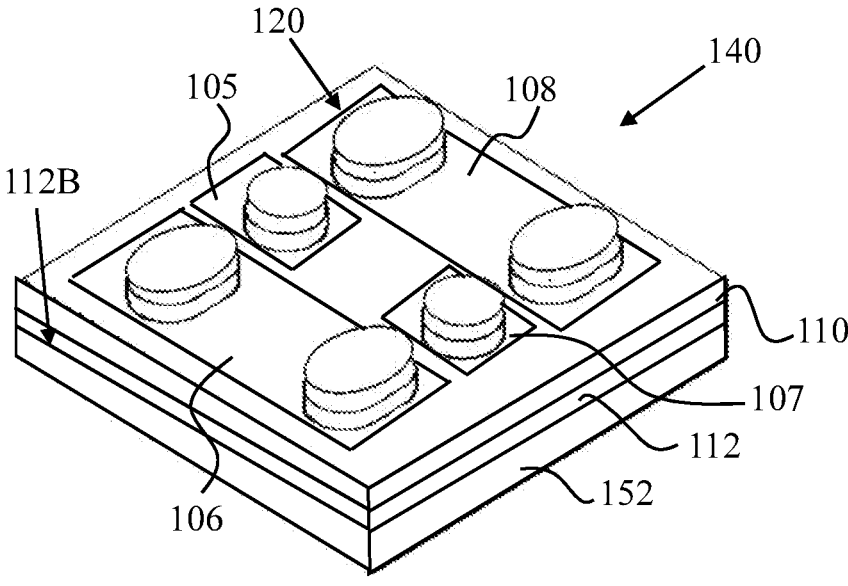

FIG. 1B shows a perspective view of a chip scale semiconductor package 140 in examples of the present disclosure. The chip scale semiconductor package 140 comprises a silicon layer 110, a back side metal layer 112, a plurality of front side pads 120, and a molding compound layer 152 directly attached to a back side 112B of the back side metal layer 112.

Figure 1C:
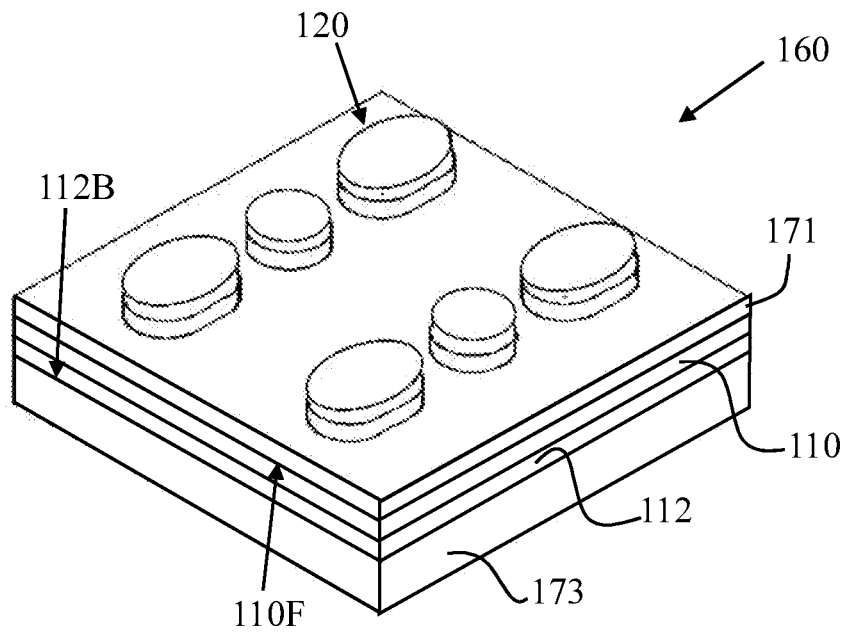

FIG. 1C shows a perspective view of a chip scale semiconductor package 160 in examples of the present disclosure. The chip scale semiconductor package 160 comprises a silicon layer 110, a back side metal layer 112, a plurality of front side pads 120, a first molding compound layer 171 attached to a front side 110F of the silicon layer 110, and a second molding compound layer 173 directly attached to a back side 112B of the back side metal layer 112. A front surface of the first molding compound layer 171 forms the outermost front surface of the chip scale semiconductor package 160. The copper member of each front side pad extends from a front surface of the front metal layer up to a height above the outermost front surface.

Figure 1D:
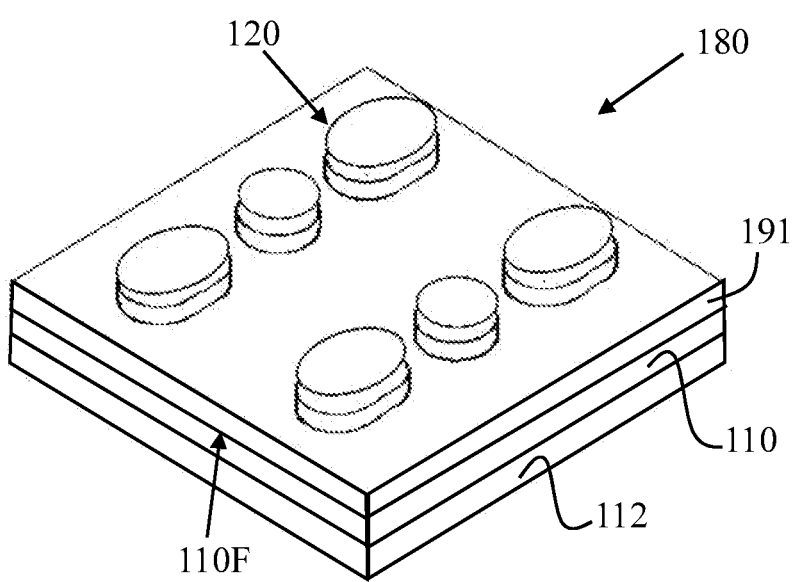

FIG. 1D shows a perspective view of a chip scale semiconductor package 180 in examples of the present disclosure. The chip scale semiconductor package 180 comprises a silicon layer 110, a back side metal layer 112, a plurality of front side pads 120, and a molding compound layer 191 attached to a front side 110F of the silicon layer 110. A front surface of the first molding compound layer 191 forms the outermost front surface of the chip scale semiconductor package 160. The copper member of each front side pad extends from a front surface of the front metal layer up to a height above the outermost front surface.

Figure 2:
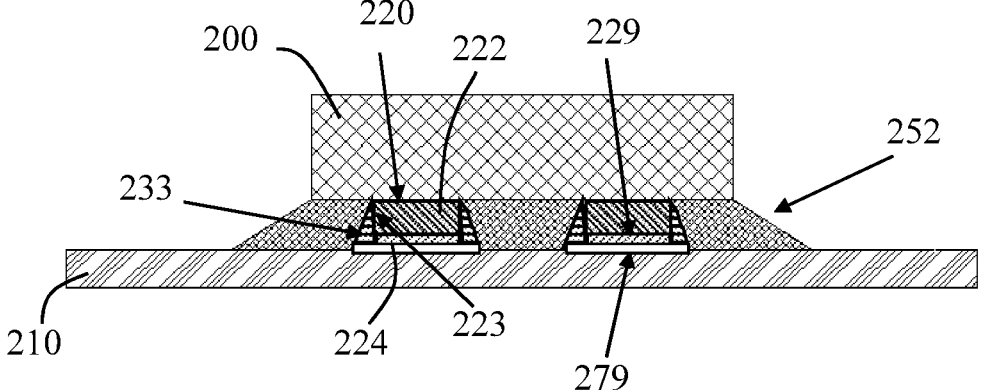
FIG. 2 shows a cross-sectional view of a chip scale semiconductor package and a PCB in examples of the present disclosure.

FIG. 2 shows a cross-sectional view of a chip scale semiconductor package 200 attached to a PCB 210 in examples of the present disclosure. The chip scale semiconductor package 200 comprises a plurality of front side pads 220 connected to connection pads on the PCB 210. Each of the plurality of front side pads 220 comprises a respective copper member 222 and a respective solder member 224. After a solder reflow process, additional respective solder 233 directly contacts a sidewall 223 of the respective copper member 222 of each of the plurality of front side pads 220. In one example, the additional respective solder 233 is of a tapered shape having larger horizontal dimension toward the PCB 210 and smaller horizontal dimension toward the back side of the respective copper member 222. The respective solder member 224 of each of the plurality of front side pads 220 directly contacts a corresponding connection pad on the PCB 210. The chip scale semiconductor package 200 may be one of chip scale semiconductor package shown in FIGS. 1A-1D.

An under-fill layer 252 positioned between an outermost front surface of the chip scale semiconductor package 200 and the PCB 210. In order to properly apply the under-fill layer 252, a minimum distance between the outermost front surface of the chip scale semiconductor package 200 and the PCB 210 is required. The minimum distance (for example, larger than 5 microns) is larger than the thickness of the solder member 224 of each of the plurality of front side pads 220, that is, for example, in a range from 1 micron to 5 microns.

A front surface area 229 of the respective copper member 222 of each of the plurality of front side pads 220 is smaller than a surface area 279 of a respective connection pad of the plurality of connection pads of the PCB 210.

Figure 3:
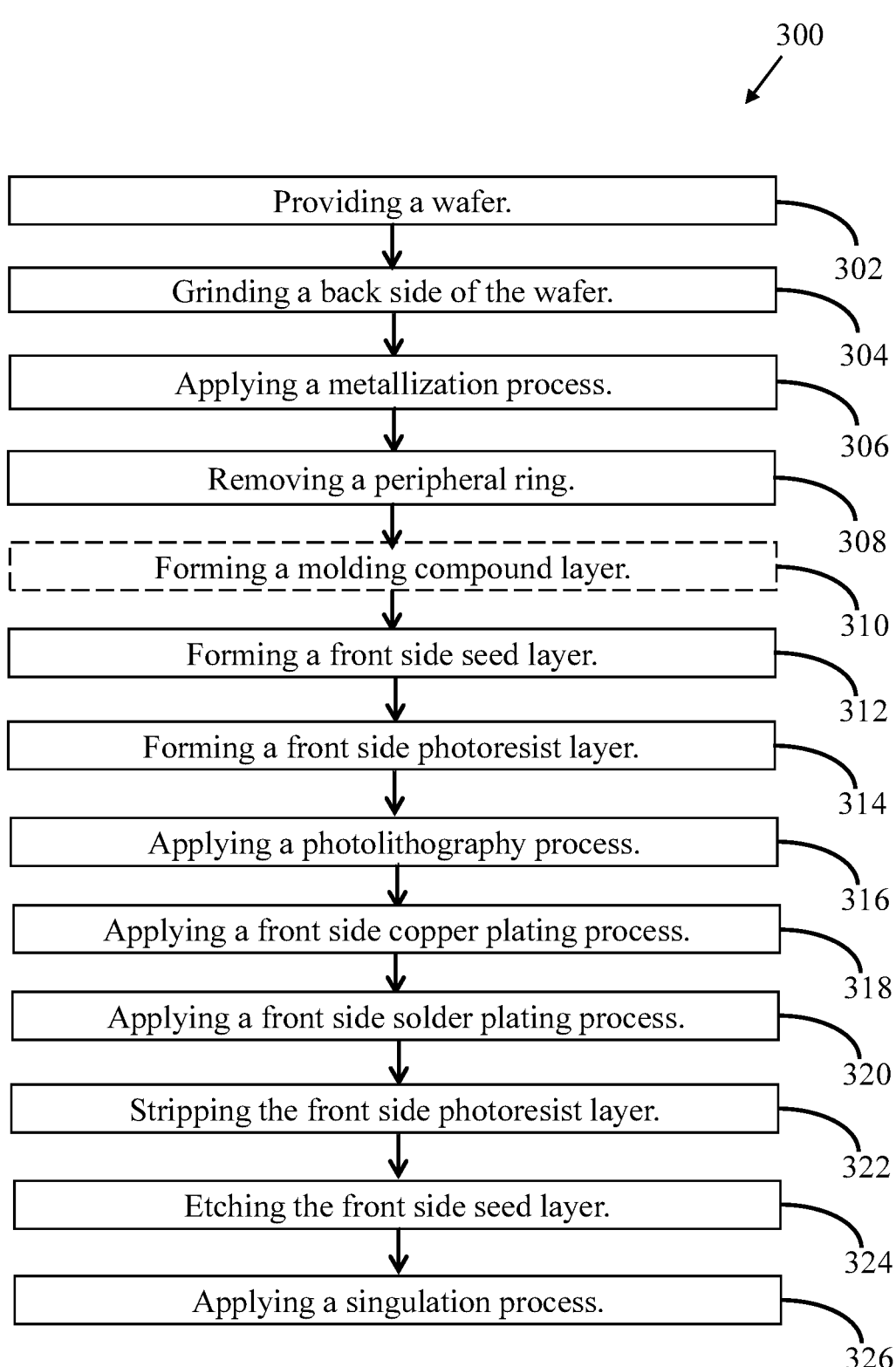
FIG. 3 is a flowchart of a process to develop a plurality of chip scale semiconductor packages in examples of the present disclosure.

FIG. 3 is a flowchart of a process 300 to develop a plurality of chip scale semiconductor packages in examples of the present disclosure. FIGS. 4A-4M show the cross sections of the corresponding steps. The process 300 may start from block 302.

Figure 4A:
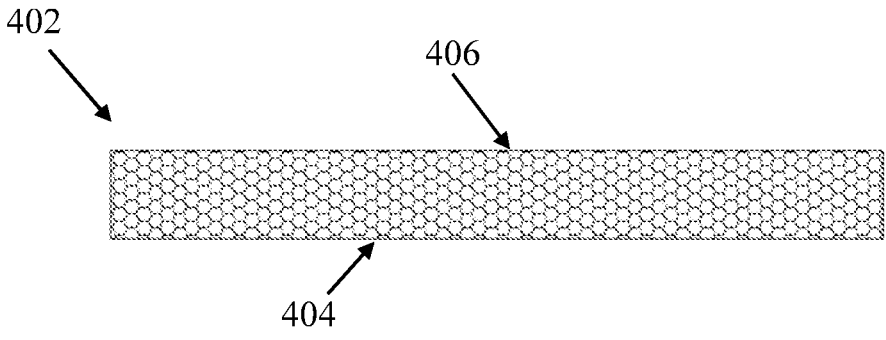
FIGS. 4A, 4B, 4C, 4D, 4E, 4F, 4G, 4H, 4I, 4J, 4K, 4L, and 4M show cross-sectional views of the steps of the process to fabricate the plurality of chip scale semiconductor packages in examples of the present disclosure.

In block 302, referring now to FIG. 4A, a wafer 402 is provided. The wafer 402 comprises a front side 404 and a back side 406 opposite the front side 404. In one example, the wafer 402 is a silicon wafer comprising a plurality of semiconductor devices formed thereon each comprising a front metal layer patterned into a plurality of front electrodes (not shown). The wafer 402 may be a 4-inch, 6-inch, 8-inch, 12-inch, or 18-inch diameter wafer. Block 302 may be followed by block 304.

Figure 4B:
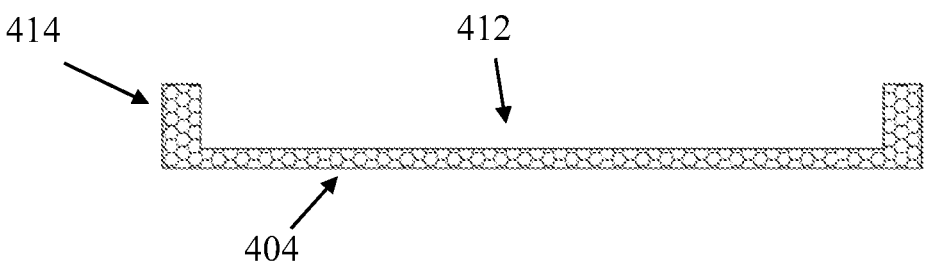

In block 304, referring now to FIG. 4B, a grinding process is applied to the back side 406 of the wafer 402 so as to thin the wafer 402 from its backside. In one example, the grinding process is only applied to a center portion of the back side 406 of the wafer 402 so as to form a recess 412 and a peripheral ring 414. The recess 412 is of a cylinder shape. The peripheral ring 414 is of a circular ring shape. The peripheral ring 414 may be a Taiko ring. The peripheral ring 414 provides required strength to support the wafer under the metallization process in block 306. Block 304 may be followed by block 306.

Figure 4C:
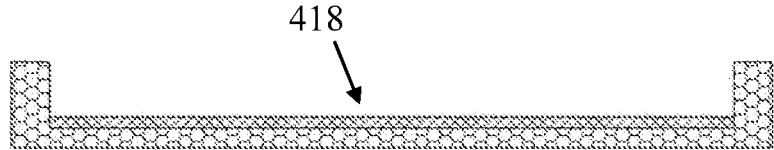

In block 306, referring now to FIG. 4C, a metallization process is applied so as to form a metal layer 418 in the recess 412. The metal layer 418 is deposited to the back side of the wafer. In one example, the metal layer 418 is made of copper. Block 306 may be followed by block 308.

Figure 4D:
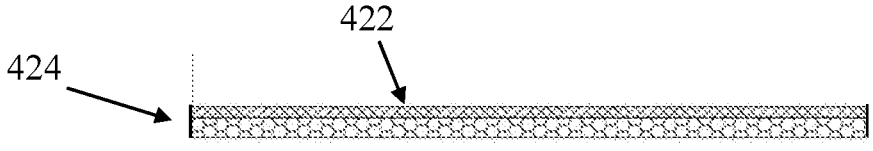

In block 308, referring now to FIG. 4D, the peripheral ring 414 (in one example, the Taiko ring) is removed so as to form a flat, circular, back surface 422. The metal layer 418 covers an entire back surface of the thinned layer 424. Block 308 may be followed by block 310 or block 312.

Figure 4E:
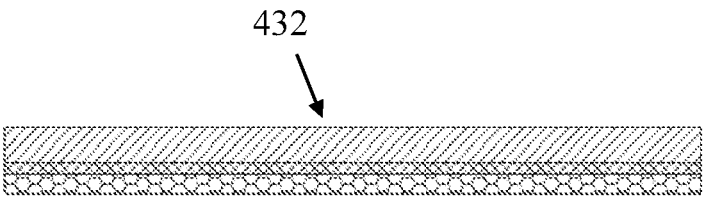

In optional block 310 (shown in dashed lines), referring now to FIG. 4E, a molding compound layer 432 overlaying the metal layer 418 is formed. In one example, the molding compound material is different from a lamination compound material. Block 310 may be followed by block 312.

Figure 4F:
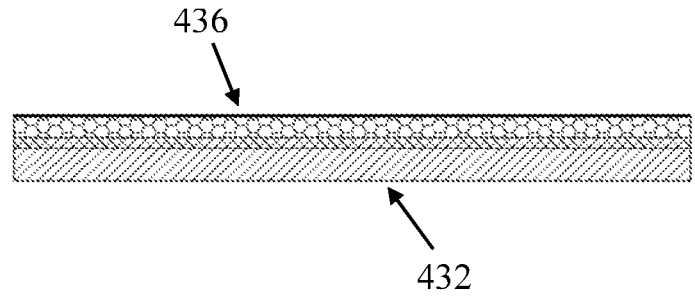

In block 312, referring now to FIG. 4F, a front side conductive seed layer 436 is formed on the front side of the wafer on top of the patterned front metal layer (before forming the front side seed layer 436, the wafer is flipped so that the front side is on top). Block 312 may be followed by block 314.

Figure 4G:
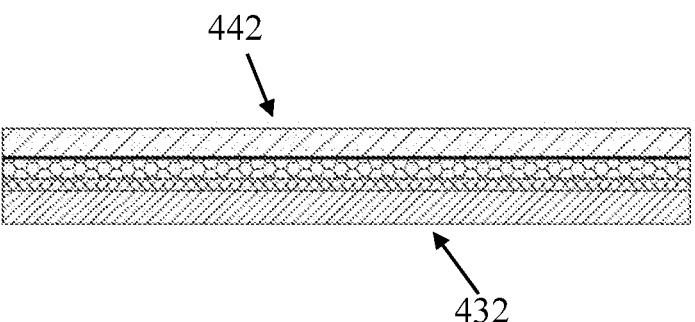

In block 314, referring now to FIG. 4G, a front side photoresist layer 442 is formed covering the seed layer 436. Block 314 may be followed by block 316.

Figure 4H:
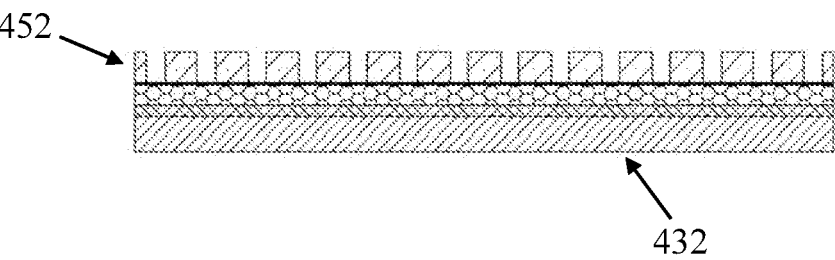

In block 316, referring now to FIG. 4H, a photolithography process is applied so as to form a pattern 452 to selectively expose areas of the seed layer 436 siting on each front electrode formed by the patterned front metal layer. Block 316 may be followed by block 318.

Figures 4I, 4J, 4K, 4L, 4M:
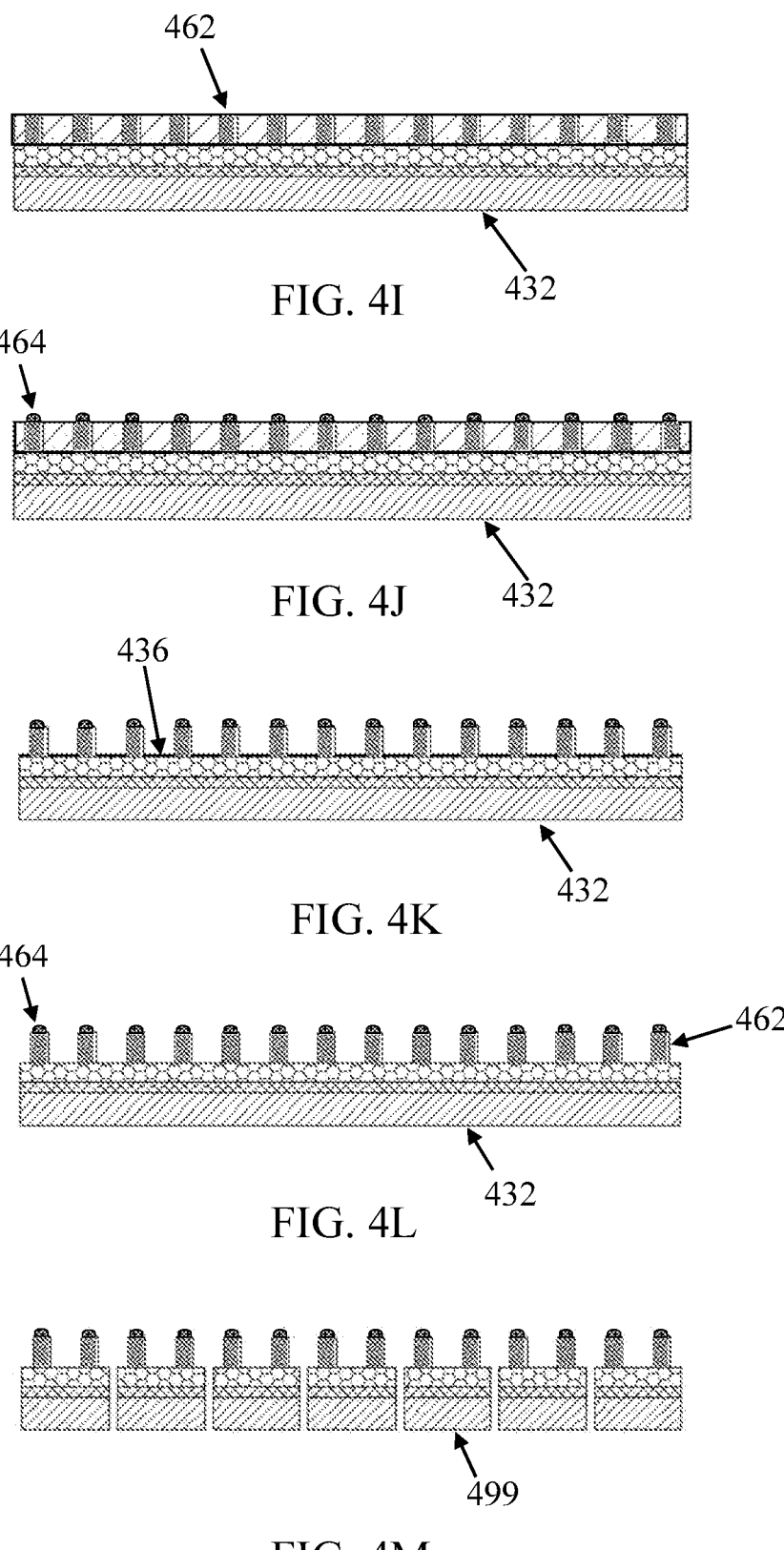

In block 318, referring now to FIG. 4I, a front side copper plating process is applied so as to form a plurality of copper members 462 on the exposed seed layer area electrically connected the respective front electrode. Block 318 may be followed by block 320.

In block 320, referring now to FIG. 4J, a front side solder plating process is applied so as to form a plurality of solder members 464 on top of each copper members 462. Block 320 may be followed by block 322.

In block 322, referring now to FIG. 4K, the front side photoresist layer 442 is stripped so as to expose areas of the front side seed layer 436 not covered by the copper member 462. Block 322 may be followed by block 324.

In block 324, referring now to FIG. 4L, the exposed front side seed layer 436 is etched. The plurality of solder members 464 are on top of the plurality of copper members 462. Block 324 may be followed by block 326.

In block 326, referring now to FIG. 4M, a singulation process is applied so as to from a plurality of chip scale semiconductor packages 499. Without performing the optional block 310, each of the plurality of chip scale semiconductor packages 499 is the chip scale semiconductor package 100 of FIG. 1A. Including performing the optional block 310, each of the plurality of chip scale semiconductor packages 499 is the chip scale semiconductor package 140 of FIG. 1B.

FIG. 5 is a flowchart of a process 500 to develop a plurality of chip scale semiconductor packages in examples of the present disclosure. FIGS. 6A-6M show the cross sections of the corresponding steps. The process 500 is similar to the process 300 except that the step of forming a front side seed layer and the step of forming a front side photoresist layer are before the step of grinding a back side of the wafer. The process 500 may start from block 502.

In block 502, referring now to FIG. 6A, a wafer 602 is provided. The wafer 602 comprises a front side 604 and a back side 606 opposite the front side 604. In one example, the wafer 602 is a silicon wafer comprising a plurality of semiconductor devices formed thereon each comprising a front metal layer patterned into a plurality of front electrodes (not shown). The wafer 602 may be a 4-inch, 6-inch, 8-inch, 12-inch, or 18-inch diameter wafer. Block 502 may be followed by block 504.

In block 504, referring now to FIG. 6B, a front side conductive seed layer 636 is formed on the front side of the wafer on top of the patterned front metal layer. Block 504 may be followed by block 506.

In block 506, referring now to FIG. 6C, a front side photoresist layer 642 is formed covering the seed layer 636. Block 506 may be followed by block 508.

In block 508, referring now to FIG. 6D, a grinding process is applied to the back side 606 of the wafer 602 so as to thin the wafer 602 from its backside (before applying the grinding process, the wafer is flipped so that the back side is on top). In one example, the grinding process is only applied to a center portion of the back side 606 of the wafer 602 so as to form a recess 612 and a peripheral ring 614. The recess 612 is of a cylinder shape. The peripheral ring 614 is of a circular ring shape. The peripheral ring 614 may be a Taiko ring. The peripheral ring 614 provides required strength to support the wafer under the metallization process in block 510. Block 508 may be followed by block 510.

Figure 6E:
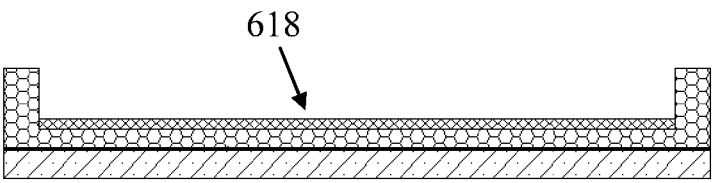

In block 510, referring now to FIG. 6E, a metallization process is applied so as to form a metal layer 618 in the recess 612. The metal layer 618 is deposited to the back side of the wafer. In one example, the metal layer 618 is made of copper. Block 510 may be followed by block 512.

Figure 6F:
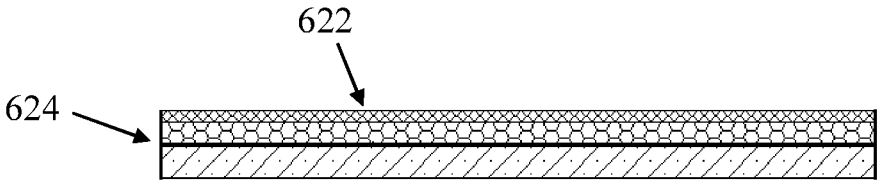

In block 512, referring now to FIG. 6F, the peripheral ring 614 (in one example, the Taiko ring) is removed so as to form a flat, circular, back surface 622. The metal layer 618 covers an entire back surface of the thinned layer 624. Block 512 may be followed by block 514 or block 516.

6

Figure 6G:
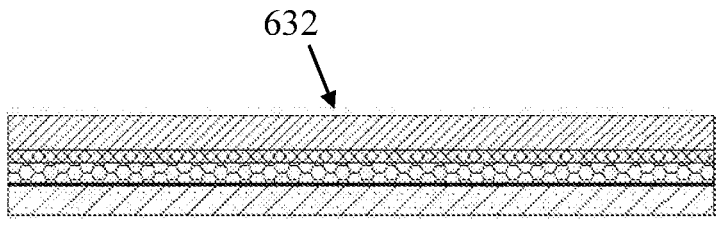

In optional block 514 (shown in dashed lines), referring now to FIG. 6G, a molding compound layer 632 overlaying the metal layer 618 is formed. In one example, the molding compound material is different from a lamination compound material. Block 514 may be followed by block 516.

Figure 6H:
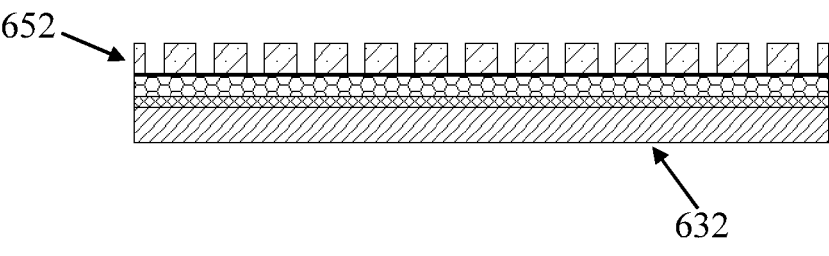

In block 516, referring now to FIG. 6H, a photolithography process is applied so as to form a pattern 652 to selectively expose areas of the seed layer 636 siting on each front electrode formed by the patterned front metal layer (before applying the photolithography process, the wafer is flipped so that the front side is on top). Block 516 may be followed by block 518.

Figures 6I, 6J, 6K, 6L, 6M:
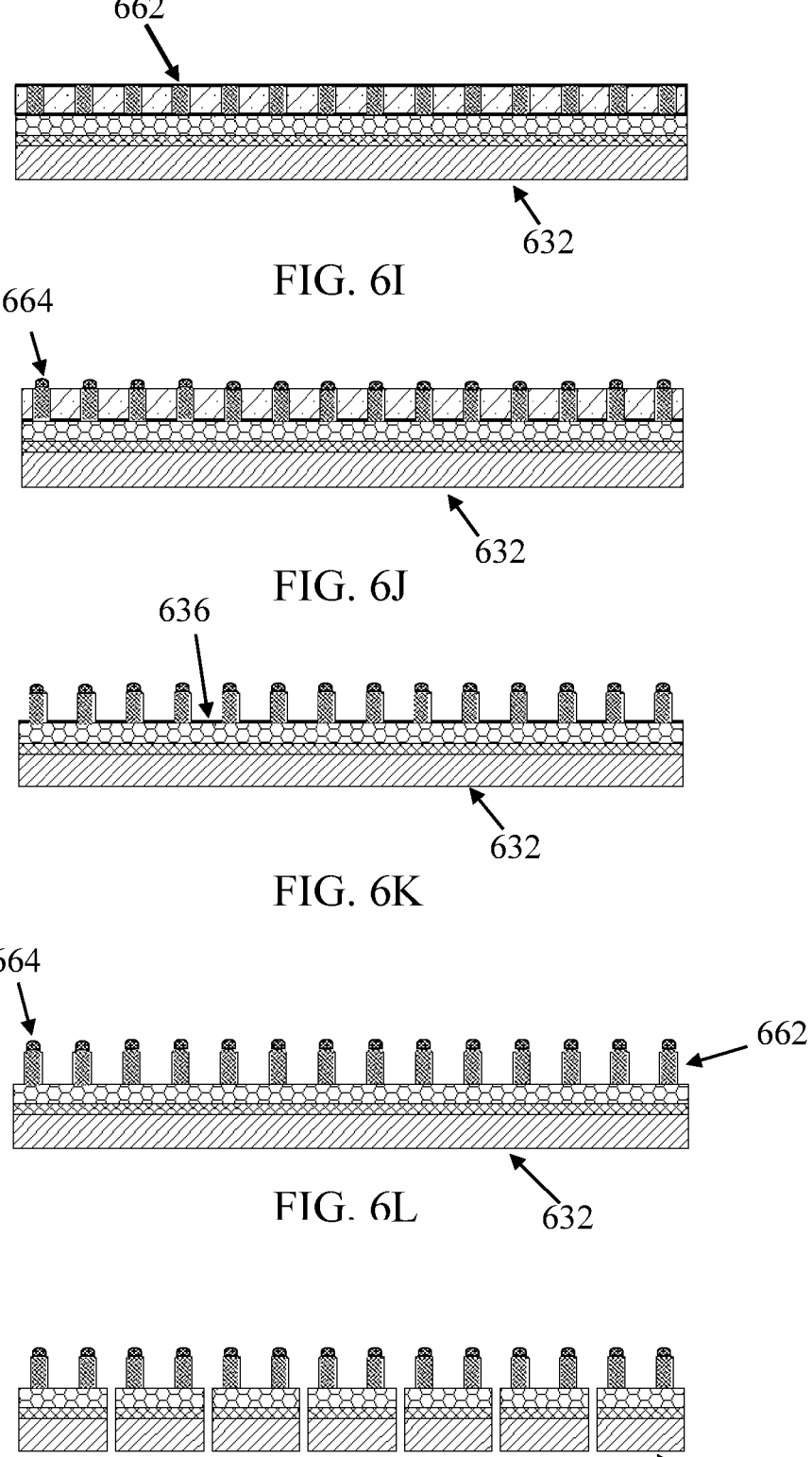

In block 518, referring now to FIG. 6I, a front side copper plating process is applied so as to form a plurality of copper members 662 on the exposed seed layer area electrically connected to the respective front electrode. Block 518 may be followed by block 520.

In block 520, referring now to FIG. 6J, a front side solder plating process is applied so as to form a plurality of solder members 664. Block 520 may be followed by block 522.

In block 522, referring now to FIG. 6K, the front side photoresist layer 642 is stripped so as to expose areas of the front side seed layer 636 not covered by the copper members 662. Block 322 may be followed by block 524.

In block 524, referring now to FIG. 6L, the exposed front side seed layer 636 is etched. The plurality of solder members 664 are on top of the plurality of copper members 662. Block 524 may be followed by block 526.

In block 526, referring now to FIG. 6M, a singulation process is applied so as to from a plurality of chip scale semiconductor packages 699.

FIG. 7 is a flowchart of a process 700 to develop a plurality of chip scale semiconductor packages in examples of the present disclosure. FIGS. 8A-8M show the cross sections of the corresponding steps. The process 700 is similar to the process 500 except that the step of applying a photolithography process, the step of applying a front side copper plating process, and the step of applying a front side solder plating process are after the step of removing a peripheral ring. The process 700 may start from block 702.

Figure 8A:
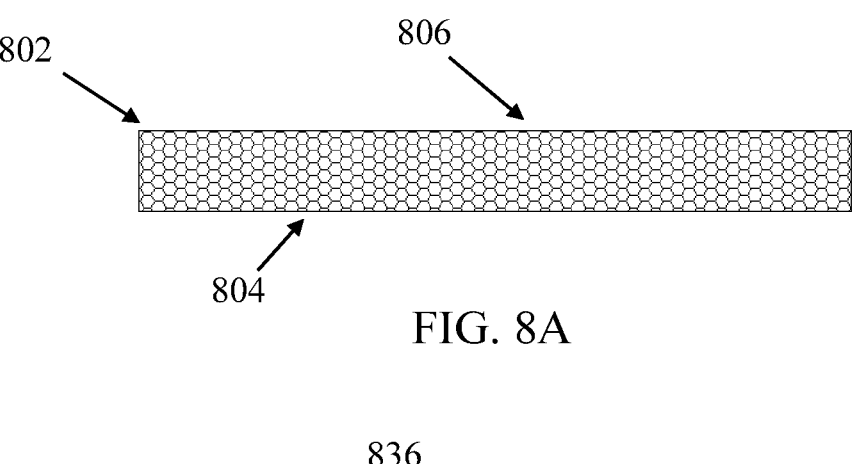
FIGS. 8A, 8B, 8C, 8D, 8E, 8F, 8G, 8H, 8I, 8J, 8K, 8L, and 8M show cross-sectional views of the steps of the process to fabricate the still other plurality of chip scale semiconductor packages in examples of the present disclosure.

In block 702, referring now to FIG. 8A, a wafer 802 is provided. The wafer 802 comprises a front side 804 and a back side 806 opposite the front side 804. In one example, the wafer 802 is a silicon wafer comprising a plurality of semiconductor devices formed thereon each comprising a front metal layer patterned into a plurality of front electrodes (not shown). The wafer 802 may be a 4-inch, 6-inch, 8-inch, 12-inch, or 18-inch diameter wafer. Block 702 may be followed by block 704.

Figure 8B:
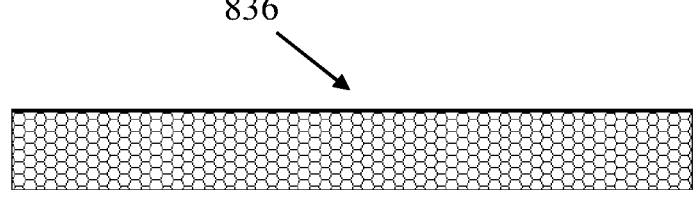

In block 704, referring now to FIG. 8B, a front side conductive seed layer 836 is formed on the front side of the wafer on top of the patterned front metal layer. Block 704 may be followed by block 706.

Figure 8C:
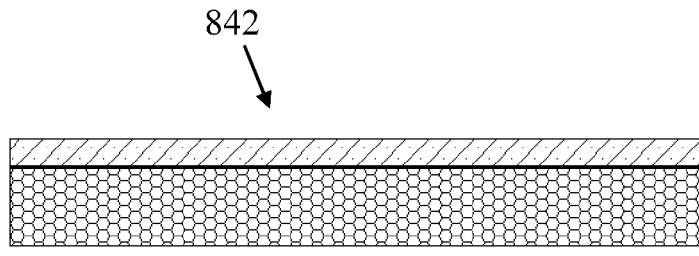

In block 706, referring now to FIG. 8C, a front side photoresist layer 842 is formed covering the seed layer 836. Block 706 may be followed by block 708.

Figure 8D:
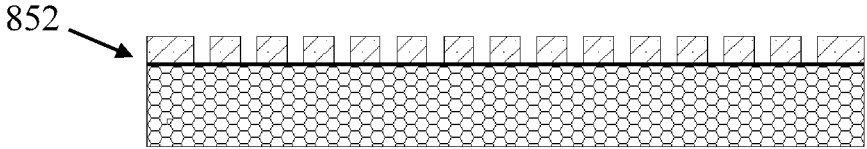

In block 708, referring now to FIG. 8D, a photolithography process is applied so as to form a pattern 852 to selectively expose areas of the seed layer 836 siting on each front electrode formed by the patterned front metal layer. Block 708 may be followed by block 710.

Figure 8E:
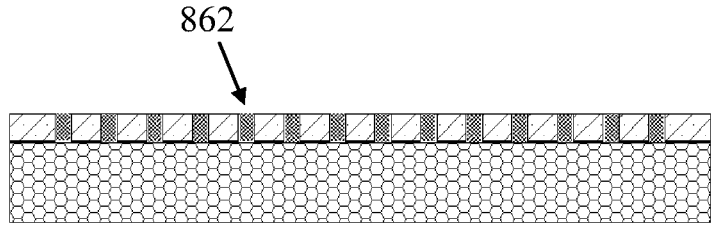

In block 710, referring now to FIG. 8E, a front side copper plating process is applied so as to form a plurality of copper members 862 on the exposed seed layer area electrically connected to the respective front electrode. Block 710 may be followed by block 712.

Figure 8F:
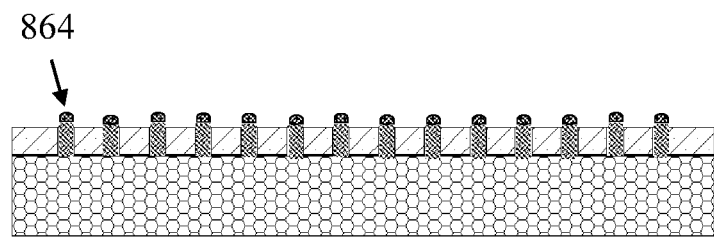

In block 712, referring now to FIG. 8F, a front side solder plating process is applied so as to form a plurality of solder members 864. Block 712 may be followed by block 714.

Figure 8G:
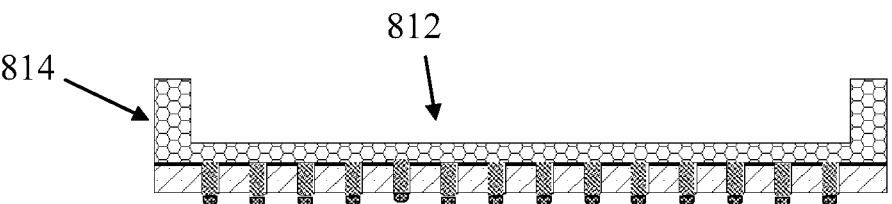

In block 714, referring now to FIG. 8G, a grinding process is applied to the back side 806 of the wafer 802 so as to thin the wafer 802 from its backside (before applying the grinding process, the wafer is flipped so that the back side is on top). In one example, the grinding process is only applied to a center portion of the back side 806 of the wafer 802 so as to form a recess 812 and a peripheral ring 814. The recess 812 is of a cylinder shape. The peripheral ring 814 is of a circular ring shape. The peripheral ring 814 may be a Taiko ring. The peripheral ring 814 provides required strength to support the wafer under the metallization process in block 716. Block 714 may be followed by block 716.

Figure 8H:
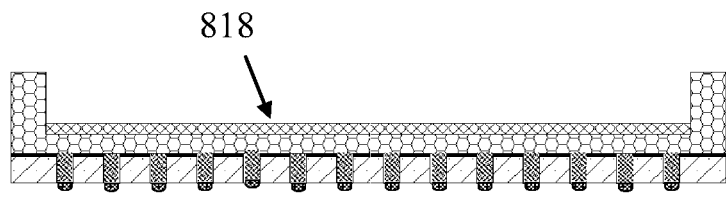

In block 716, referring now to FIG. 8H, a metallization process is applied so as to form a metal layer 818 in the recess 812. The metal layer 818 is deposited to the back side of the wafer. In one example, the metal layer 818 is made of copper. Block 716 may be followed by block 718.

Figures 8I, 8J, 8K, 8L, 8M:
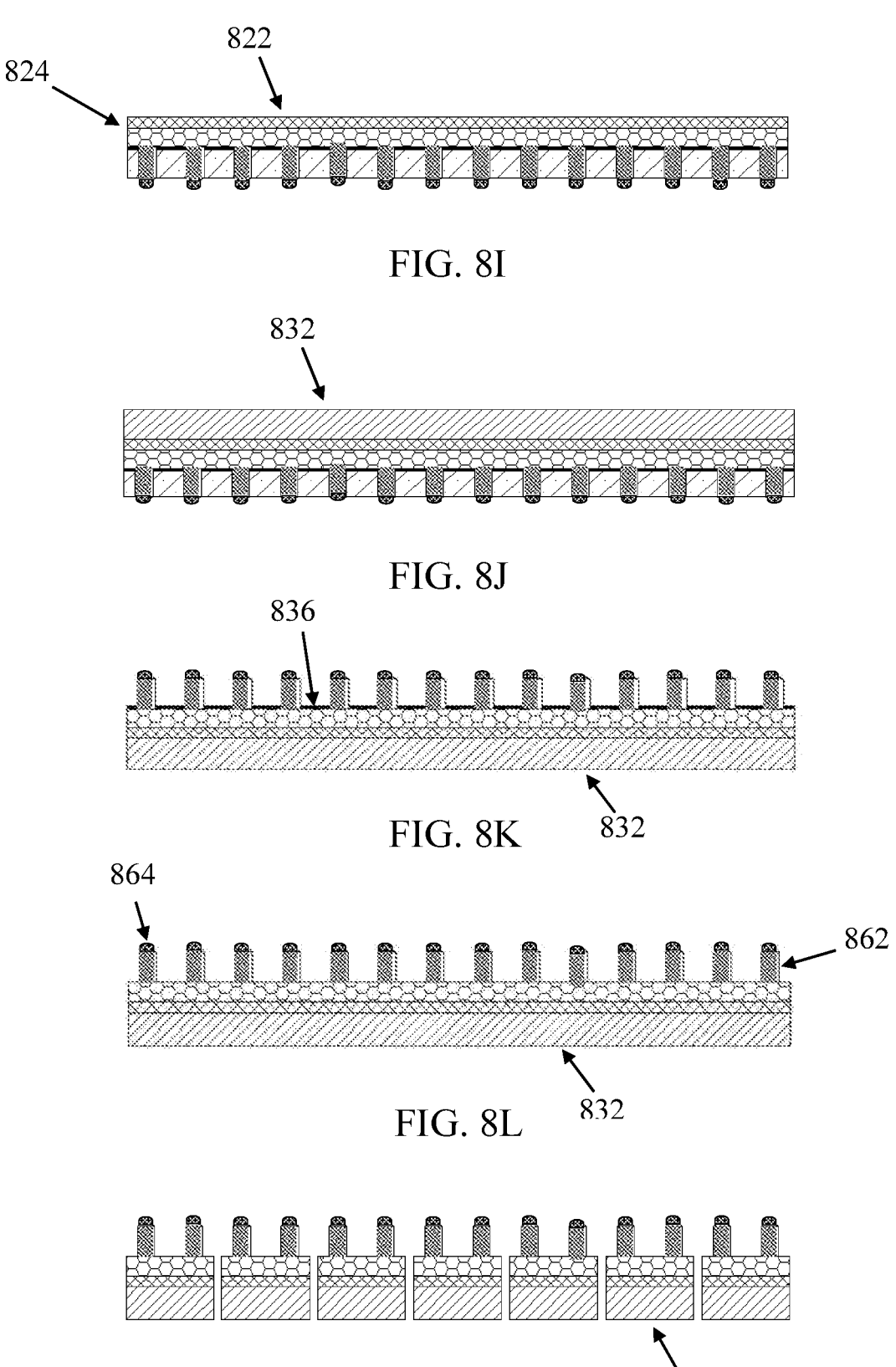

In block 718, referring now to FIG. 8I, the peripheral ring 814 (in one example, the Taiko ring) is removed so as to form a flat, circular, back surface 822. The metal layer 818 covers an entire back surface of the thinned layer 824. Block 718 may be followed by block 720 or block 722.

In optional block 720 (shown in dashed lines), referring now to FIG. 8J, a molding compound layer 832 overlaying the metal layer 818 is formed. In one example, the molding compound material is different from a lamination compound material. Block 720 may be followed by block 722.

In block 722, referring now to FIG. 8K, the front side photoresist layer 842 is stripped so as to expose areas of the front side seed layer 836 not covered by the copper members 862 (before stripping the front side photoresist layer 842, the wafer is flipped so that the front side is on top). Block 722 may be followed by block 724.

In block 724, referring now to FIG. 8L, the exposed front side seed layer 836 is etched. The plurality of solder members 864 are on top of the plurality of copper members 862. Block 724 may be followed by block 726.

In block 726, referring now to FIG. 8M, a singulation process is applied so as to from a plurality of chip scale semiconductor packages 899.

Figure 10A:
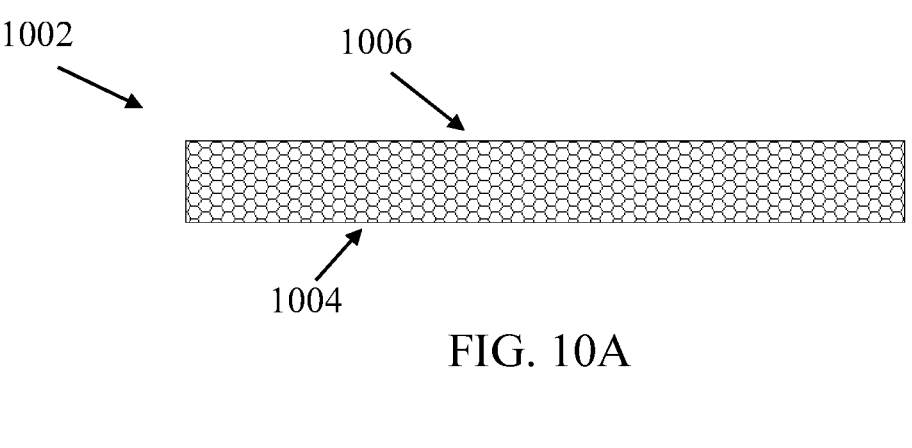
FIGS. 10A, 10B, 10C, 10D, 10E, 10F, 10G, 10H, 10I, 10J, 10K, 10L, 10M, 10N, and 10O show cross-sectional views of the steps of the process to fabricate the yet still other plurality of chip scale semiconductor packages in examples of the present disclosure.

FIG. 9 is a flowchart of a process 900 to develop a plurality of chip scale semiconductor packages in examples of the present disclosure. FIGS. 10A-10O show the cross sections of the corresponding steps. The process 900 may start from block 902.

In block 902, referring now to FIG. 10A, a wafer 1002 is provided. The wafer 1002 comprises a front side 1004 and a back side 1006 opposite the front side 1004. In one example, the wafer 1002 is a silicon wafer comprising a plurality of semiconductor devices formed thereon each comprising a front metal layer patterned into a plurality of front electrodes (not shown). The wafer 1002 may be a 4-inch, 6-inch, 8-inch, 12-inch, or 18-inch diameter wafer. Block 902 may be followed by block 904.

Figure 10B:
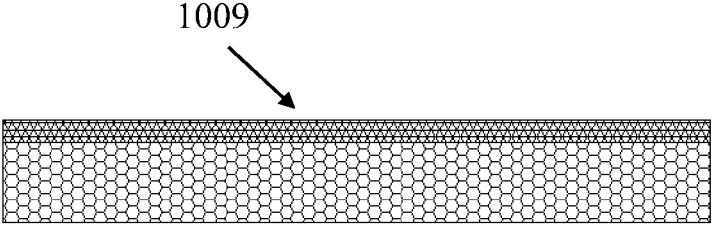

In block 904, referring now to FIG. 10B, a front side molding compound layer 1009 is formed. In one example, the molding compound material is different from a lamination compound material. Block 904 may be followed by block 906.

Figure 10C:
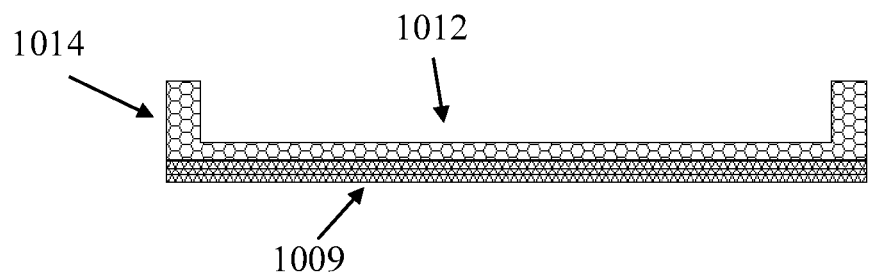

In block 906, referring now to FIG. 10C, a grinding process is applied to the back side 1006 of the wafer 1002 so as to thin the wafer 1002 from its backside (before applying the grinding process, the wafer is flipped so that the back side is on top). In one example, the grinding process is only applied to a center portion of the back side 1006 of the wafer 1002 so as to form a recess 1012 and a peripheral ring 1014. The recess 1012 is of a cylinder shape. The peripheral ring 1014 is of a circular ring shape. The peripheral ring 1014 may be a Taiko ring. The peripheral ring 1014 provides required strength to support the wafer under the metallization process in block 908. Block 906 may be followed by block 908.

Figure 10D:
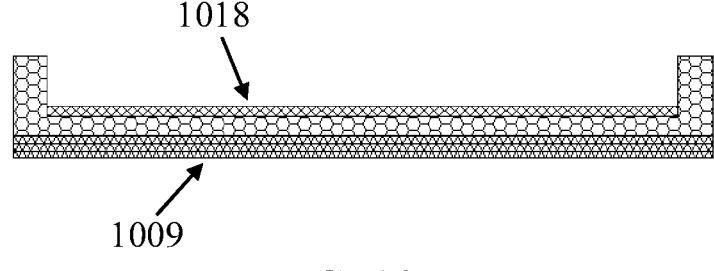

In block 908, referring now to FIG. 10D, a metallization process is applied so as to form a metal layer 1018 in the recess 1012. The metal layer 1018 is deposited to the back side of the wafer. In one example, the metal layer 1018 is made of copper. Block 908 may be followed by block 910.

Figure 10E:
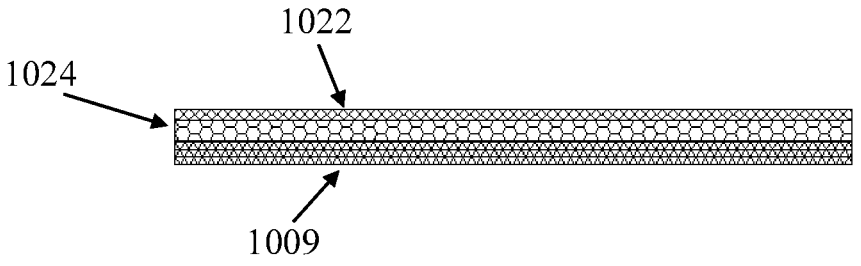

In block 910, referring now to FIG. 10E, the peripheral ring 1014 (in one example, the Taiko ring) is removed so as to form a flat, circular, back surface 1022. The metal layer 1018 covers an entire back surface of the thinned layer 1024. Block 910 may be followed by block 912 or block 914.

Figure 10F:
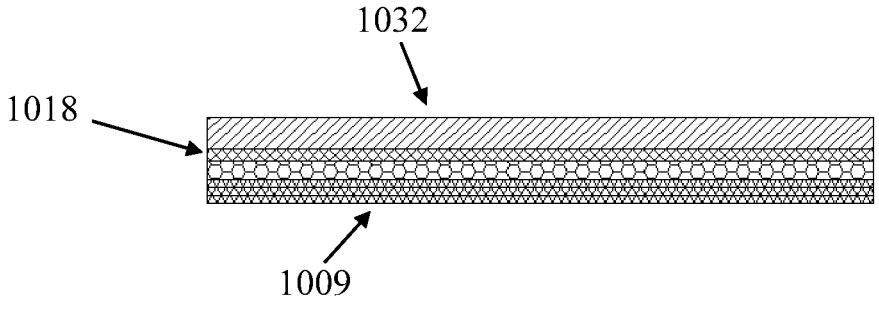

In optional block 912 (shown in dashed lines), referring now to FIG. 10F, a molding compound layer 1032 is formed on the metal layer 1018. In one example, the molding compound material is different from a lamination compound material. Block 912 may be followed by block 914.

Figure 10G:
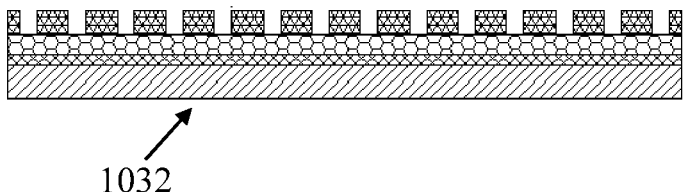

In block 914, referring now to FIG. 10G, a drilling process is applied so as to form a patterned front side molding compound layer 1011 (before applying the drilling process, the wafer is flipped so that the front side is on top). Front metal layer is exposed through the drill holes. Block 914 may be followed by block 916.

Figure 10H:
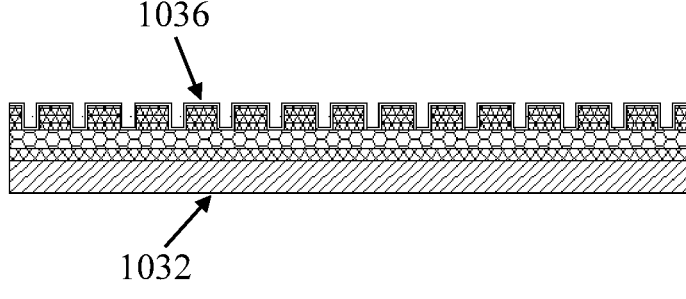

A In block 916, referring now to FIG. 10H, a front side conductive seed layer 1036 is disposed on the front side of the wafer. The exposed front metal layer is covered with the seed layer. Block 916 may be followed by block 918.

Figure 10I:
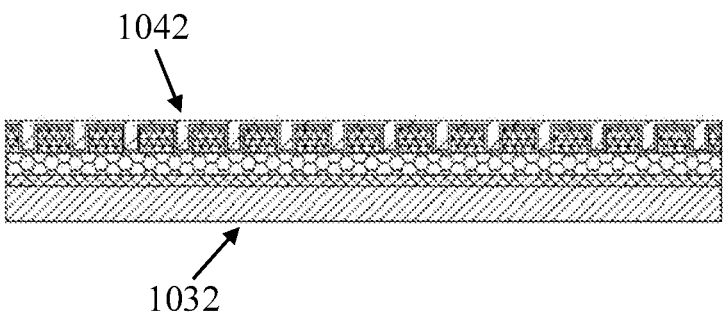

In block 918, referring now to FIG. 10I, a front side photoresist layer 1042 is formed covering the entire seed layer 1036. Block 918 may be followed by block 920.

Figure 10J:
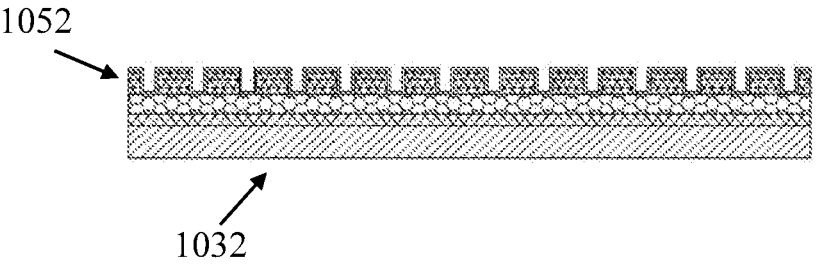

In block 920, referring now to FIG. 10J, a photolithography process is applied so as to form a pattern 1052 to exposed the seed layer at bottoms of the drill holes. Block 920 may be followed by block 922.

Figure 10K:
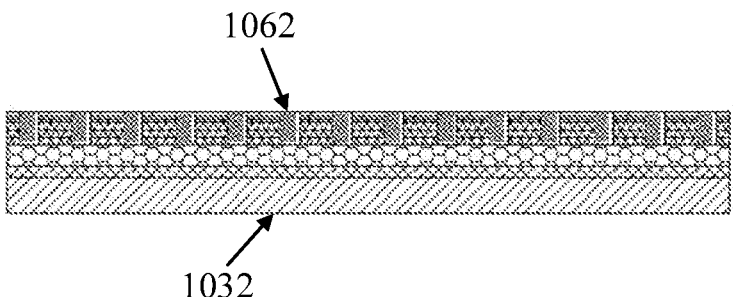

In block 922, referring now to FIG. 10K, a front side copper plating process is applied so as to form a plurality of copper members 1062. Block 922 may be followed by block 924.

Figure 10L:
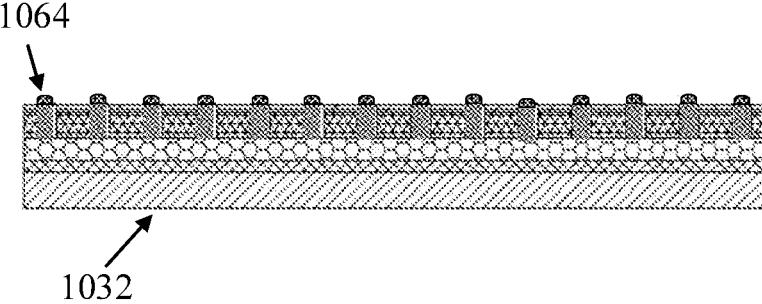

In block 924, referring now to FIG. 10L, a front side solder plating process is applied so as to form a plurality of solder members 1064. Block 924 may be followed by block 926.

Figure 10M:
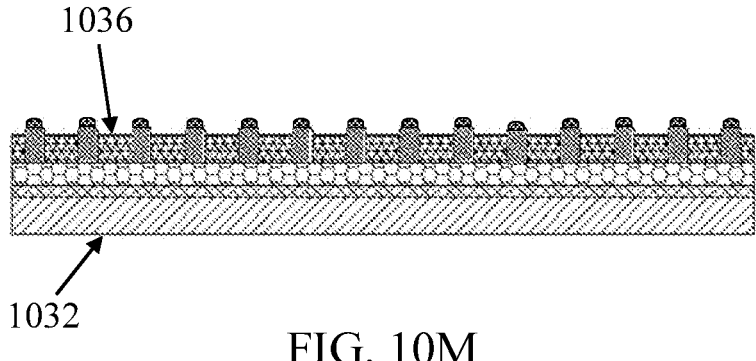

In block 926, referring now to FIG. 10M, the front side photoresist layer 1042 is stripped so as to expose the front side seed layer 1036 on top of the front side molding compound layer 1009. Block 926 may be followed by block 928.

Figure 10N:
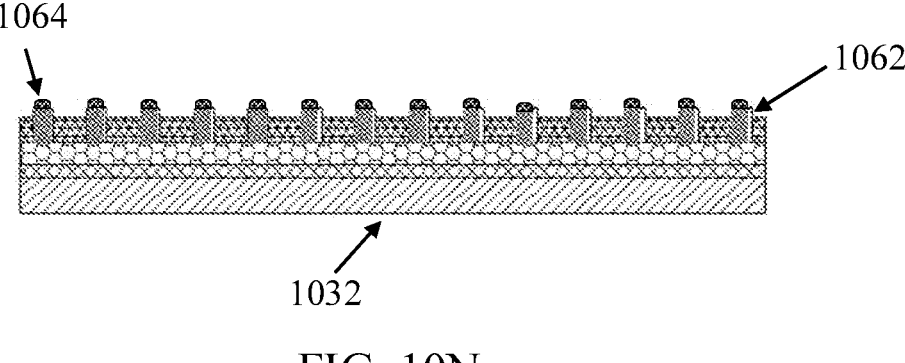
Figure 10O:
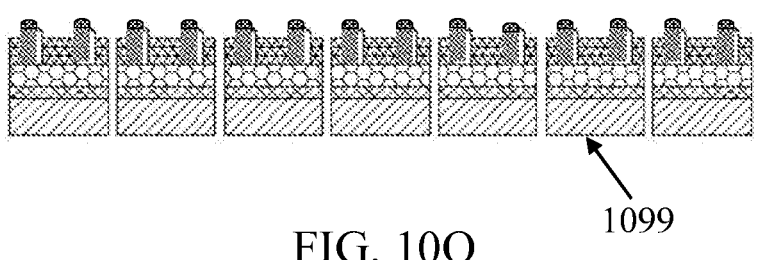

In block 928, referring now to FIG. 10N, the exposed front side seed layer 1036 is etched. The plurality of solder members 1064 are on top of the plurality of copper members 1062. Block 928 may be followed by block 930.

In block 930, referring now to FIG. 10O, a singulation process is applied so as to from a plurality of chip scale semiconductor packages 1099. Without performing the optional block 912, each of the plurality of chip scale semiconductor packages 1099 is the chip scale semiconductor package 180 of FIG. 1C. Including performing the optional block 912, each of the plurality of chip scale semiconductor packages 1099 is the chip scale semiconductor package 160 of FIG. 1D.

Those of ordinary skill in the art may recognize that modifications of the embodiments disclosed herein are possible. For example, a number of the plurality of front side pads 120 may vary. Other modifications may occur to those of ordinary skill in this art, and all such modifications are deemed to fall within the purview of the present invention, as defined by the claims.

The invention claimed is:

1. A method for fabricating a chip scale semiconductor package, the method comprising the steps of:

providing a wafer, the wafer comprising a front side and a back side opposite the front side;

grinding the back side of the wafer forming a peripheral ring;

applying a metallization process to a grinded surface;

removing the peripheral ring;

forming a front side seed layer;

forming a front side photoresist layer;

applying a photolithography process;

applying a front side copper plating process;

applying a front side solder plating process;

stripping the front side photoresist layer;

etching the front side seed layer; and applying a singulation process so as to separate the chip scale semiconductor package from other chip scale semiconductor packages.

2. The method of claim 1, wherein the step of forming the front side seed layer is after the step of removing the peripheral ring; and wherein the step of forming the front side photoresist layer is after the step of forming the front side seed layer.

3. The method of claim 1, wherein the step of forming the front side seed layer is before the step of front side photoresist layer; and wherein the step of forming the front side photoresist layer is before the step of grinding the back side of the wafer.

4. The method of claim 1, wherein the step of forming the front side seed layer is before the step of front side photoresist layer; and wherein the step of forming the front side photoresist layer is before the step of applying the photolithography process; wherein the step of applying the front side solder plating process is before the step of grinding the back side of the wafer.

5. The method of claim 1 further comprising after the step of removing the peripheral ring, forming a molding compound layer on a metal layer formed by the metallization process.

6. The method of claim 1, wherein the chip scale semiconductor package comprises a silicon layer;

a back side metal layer; and a plurality of front side pads;

wherein each of the plurality of front side pads comprises a respective copper member; and a respective solder member; and wherein a back surface of the respective solder member is directly attached to a front surface of the respective copper member.

7. The method of claim 6, wherein a thickness of the respective copper member of each of the plurality of front side pads is in a range from twenty-five microns to fifty microns; and wherein a thickness of the respective solder member of each of the plurality of front side pads is in a range from one micron to five microns.

8. The method of claim 6, wherein the chip scale semiconductor package is attached to a printed circuit board (PCB);

wherein additional respective solder directly contacts a sidewall of the respective copper member of each of the plurality of front side pads; and wherein the respective solder member of each of the plurality of front side pads directly contacts the PCB.

9. A method for fabricating a chip scale semiconductor package, the method comprising the steps of:

providing a wafer, the wafer comprising a front side and a back side opposite the front side;

forming a front side molding compound layer;

grinding the back side of the wafer forming a peripheral ring;

applying a metallization process to a grinded surface;

removing the peripheral ring;

applying a laser drill process;

forming a front side seed layer;

forming a front side photoresist layer;

applying a photolithography process;

applying a front side copper plating process;

applying a front side solder plating process;

stripping the front side photoresist layer;

etching the front side seed layer; and applying a singulation process so as to separate the chip scale semiconductor package from other chip scale semiconductor packages.

10. The method of claim 9, further comprising before the step of applying the laser drill process, forming a back side molding compound layer.

11. The method of claim 9, wherein the chip scale semiconductor package comprises a silicon layer;

a back side metal layer; and a plurality of front side pads;

wherein each of the plurality of front side pads comprises a respective copper member; and a respective solder member; and wherein a back surface of the respective solder member is directly attached to a front surface of the respective copper member.

12. The method of claim 11, wherein a thickness of the respective copper member of each of the plurality of front side pads is in a range from twenty-five microns to fifty microns; and wherein a thickness of the respective solder member of each of the plurality of front side pads is in a range from one micron to five microns.

\* \* \* \* \*